April 26, 1966 HUNG CHANG LIN 3,248,563

LOW POWER SEMICONDUCTOR LOGIC CIRCUIT

Filed Sept. 10, 1962 2 Sheets-Sheet 1

WITNESSES

Edwin E. Bassler
Dean Schron

INVENTOR

Hung Chang Lin

BY Ernest P. Klipfel

ATTORNEY 3,248,563
Patented Apr. 26, 1966

3,248,563

LOW POWER SEMICONDUCTOR LOGIC CIRCUIT

Hung Chang Lin, Monroeville, Pa., assignor to Westinghouse Electric Corporation, Pittsburgh, Pa., a corporation of Pennsylvania Filed Sept. 10, 1962, Ser. No. 222,565
5 Claims. (Cl. 307—88.5)

This invention relates in general to transistor logic circuits, and more particularly to a current supply means therefor.

Transistors, used as switching elements, find many applications in logic circuitry. Transistors used in such circuits are operable in an ON state of operation and an OFF state of operation, and when in said ON state of operation are in a saturated condition. Often, many stages of logic circuitry are coupled together and are responsive to input signals to give predetermined output signals. When so utilized, the transistor of the logic circuitry requires a predetermined specifiied current for proper operation, which is generally supplied by a voltage source and a linear resistance. With the advent of microminiature and molecular electronic circuits an important consideration in the design of such logic circuit is power dissipation. Another important consderation is the maintai of the predetermined current. For optimum regulation, to obtain the predetermined current, a high resistance is generally utilized. The transistors of the stages of the logic circuit have various operating characteristics which may change slightly from transistor to transistor or from stage to stage due to the loading, temperature variations, aging and the variations from unit to unit. Generally, the higher the value of resistance used in the current supply circuit for the transistors, the less noticeable will be these varying characteristics. This regulation, however, is obtained only by the use of high voltage supplies and high resistances which cause a greater power dissipation in the circuits utilized.

It is therefore one object of the present invention to provide an improved logic circuit which operates at reduced power dissipation.

It is a further object of the present invention to provide a logic circuit which is better regulated regardless of variations in the operating characteristcs of the transistors utilized therein.

It is another object to provide a transistor logic circuit wherein the current supply means therefor provides a substantially constant current over predetermined voltage ranges.

A further object is to provide a current supply means for a transistor logic circuit which will provide various constant currents depending upon the mode of operation of the trasistor logic circuitry.

Another object is to provide a transistor logic circuit which includes a non-linear resistance means in the current supply circuit therefor.

Briefly, in accordance with the objects of the present invention, there is provided a transistor logic circuit which includes a first stage having at least one transistor and a current supply means which includes a non-linear resistance to provide a substantially constant current to match an operating characteristic of the transistor, or transistors, of the first statge. To this end the non-linear resistance of the current supply means comprises a tunnel diode device in parallel circuit configuration with a resistance element. The first stage is responsive to input signals to provide a predetermined output signal which may be received by a second transistor stage. The parallel circuit configuration of the tunnel diode and resistor provides a substantially constant current over predetermined voltage ranges. By choosing tunnel diodes with different characteristic curves a series arrangement of sets of tunnel diodes and resistors may be provided to supply constant currents of differing amplitudes, as required, over different predetermined voltage ranges. A first substantially constant current may be provided to match the saturation characteristics of the transistors of a first stage despite slight variations in the saturation characteristics, and a second substantially constant current may be provided to match the input characteristics of a second stage wherein the current remains substantially constant despite slight variations in the input characteristics.

The above stated and further objects of the invention will become apparent upon reading of the following detailed specification with reference to the accompanying drawings, in which.

Figure 1:
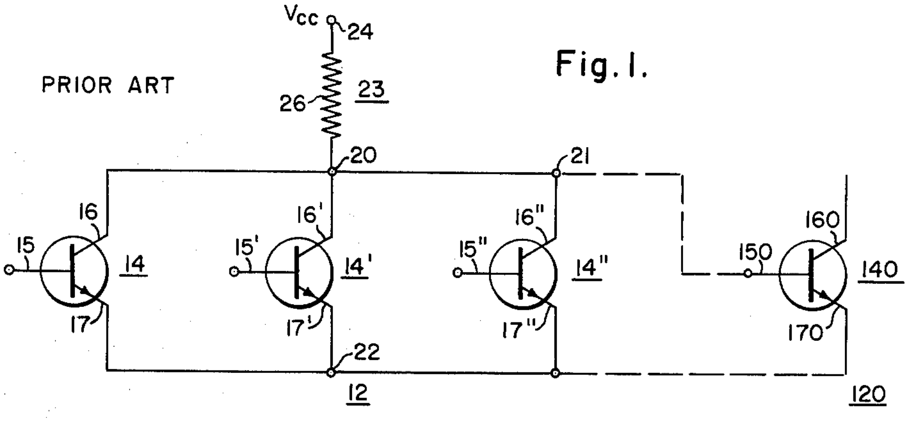
FIGURE 1 shows a transistor logic circuit of the prior art.

Referring now to FIG. 1, and by way of example, there is shown a direct coupled transistor logic circuit of the prior art. The circuit shown in FIG. 1 is a NOR circuit and such circuits will produce a binary ONE output signal when all of the input signals are binary ZEROS, and will produce a binary ZERO output signal if any of its input signals is a binary ONE. The NOR circuit shown includes a first stage 12 having transistors 14, 14′, and 14″. The collectors 16, 16′, and 16″ of transistors 14, 14′ and 14″ are all connected to a common point 20. In a similar manner the emitters 17, 17′, and 17″ are all connected to a common point 22. The collector-emitter circuits of the transistors therefor are in parallel circuit configuration. Each transistor has a control, or input electrode associated therewith, such as control electrode 15 for transistor 14, control electrode 15′ for transistor 14′, and control electrode 15″ for transistor 14″. Any output signal from the first stage 12 may appear at output terminal 21 to be fed into additional stages such as stage 120 partially shown and having at least a transistor 140 which includes a collector electrode 160, emitter electrode 170, and a control electrode 150 which is connected to the output terminal 21 of the first stage 12. A current supply means 23 for the transistors include terminal 24 which may be connected to any suitable source of positive potential, and load resistor 26 connected between terminal 24 and the common point 20. In operation, the transistors act as either an open or closed switch. For example, if the control electrode 15 of transistor 14 receives an input signal, the transistor 14 will be driven into saturation and will act as a closed switch thus affording a path for iasing current which causes output terminal 21 to assume a substantially ground potential, and therefore no output signal is passed on to the second stage 120. In the absence of any input signals on the control electrodes 15, 15′ or 15″ each of the transistors 14, 14′ and 14″ will act as open circuits, and the operating current will then pass to the control electrode 150 of the second stage 120. For proper operation of the direct coupled transistor logic NOR circuit shown, as well as other types of logic circuits, various predetermined biasing currents are utilized. In the circuit of FIG. 1, a first constant current is utilized in the first stage when any of the transistors are driven to saturation, and a second predetermined constant current is utilized in the second stage when there are no input signals appearing on the control electrodes 15, 15′ and 15″. The supply voltage $V_{cc}$ is chosen such that the saturation characteristics of the transistors meets the load line, as determined by resistor 26, at the desired predetermined operating current. However, due to variations in the saturation characteristics of the transistors used, which may come about from aging, temperature variations or differences between the transistors themselves, the predetermined constant current desired may not always be maintained.

Figure 2:
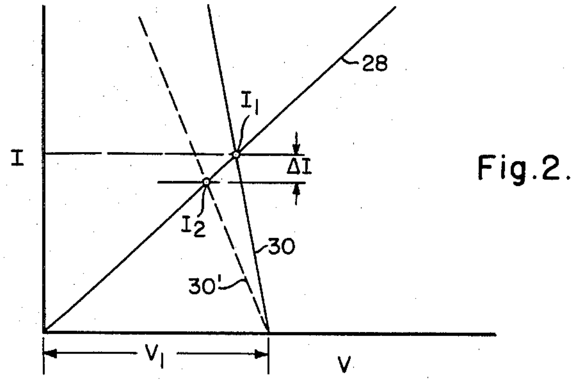
FIGS. 2 and 3 are voltage current characteristic curves to aid in an understanding of the problems of the prior art circuit shown in FIG. 1.

With specific reference to the problems involved in varying characteristics, reference should now be made to FIG. 2. A load line 28, as determined by the resistor 26, is plotted from left to right, and the saturation characteristics of one of the transistors, for example transistor 14′, is plotted from right to left. The voltage $V_1$ represents the collector voltage $V_{cc}$ and it may be seen that the saturation characteristic 30 intrsects the load line 28 to define a predetermined operating current $I_1$. Suppose for example that the saturation characteristic 30 varies and shifts to a new position 30′ such that the intersection with the load line 28 now defines a second operating point at a current of $I_2$. This varying of the saturation characteristic causes a variation in operating current of $\Delta I$ which is undesirable.

Figure 3:
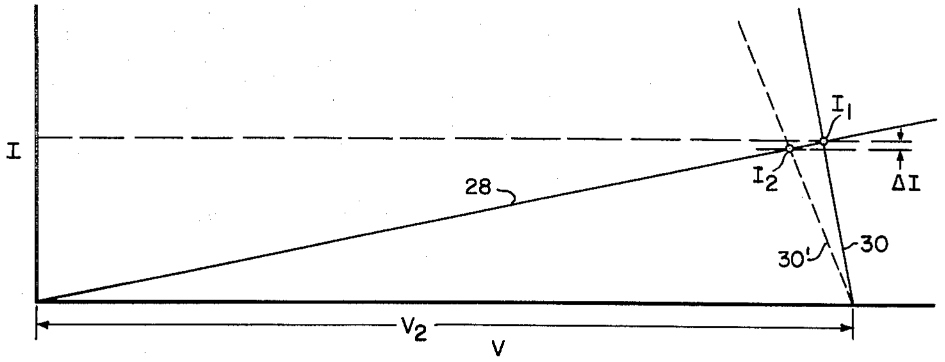

FIG. 3 shows one method of reducing $\Delta I$ so that the operating current will remain substantially constant despite variations in the saturation characteristic. By increasing the supply voltage to a value $V_2$, as shown, and by increasing the value of resistor 26, the resistance load line is caused to assume a more horizontal position such that intersection with the saturation characteristic 30 still produce the same $I_1$. In this case, however, if the saturation characteristic varies to a new position 30′, the intersection with the load line 28 will be at a new position $I_2$ and the difference between $I_1$ and $I_2$ will be a $\Delta I$ substantially smaller than the $\Delta I$ of the example of FIG. 2. This increase in reliability however, is obtained only at a sacrifice of greater power dissipation since a much larger supply voltage is required, as is a much larger value of resistance. The greater power dissipation is undesirable especially if the logic circuit is in a molecular functional block form.

Figure 4:
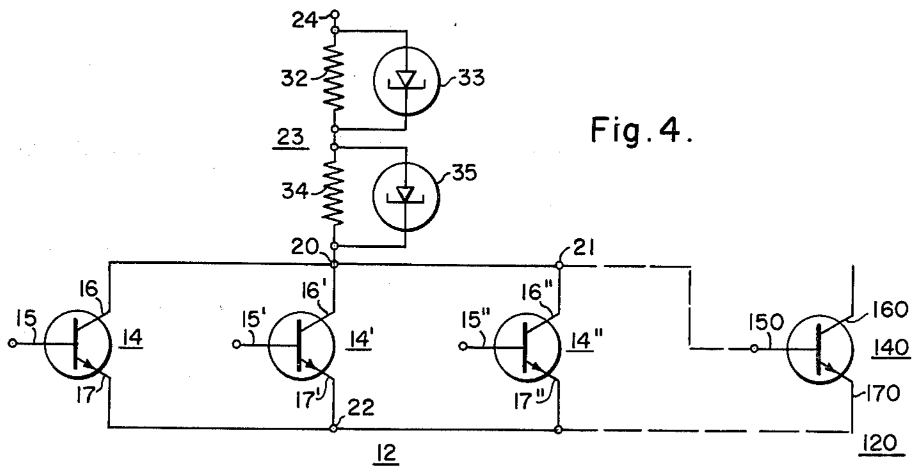
FIG. 4 shows one embodiment of the present invention.
Figure 5:
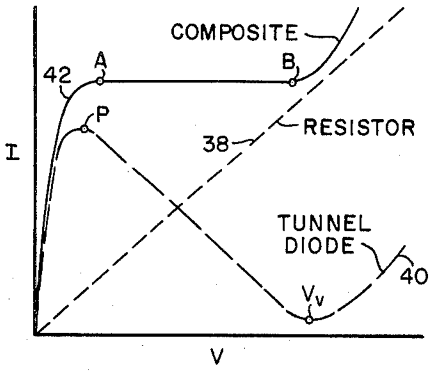
FIG. 5 shows a voltage current characteristic curve obtained from a parallel circuit configuration of a tunnel diode and a resistance element.
Figure 6:
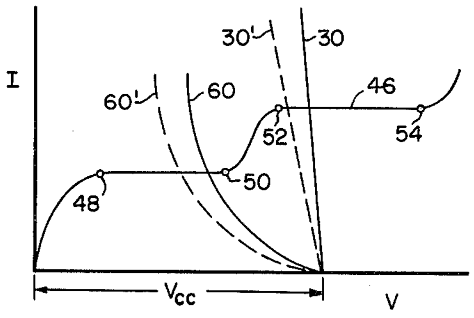
FIG. 6 is a voltage current characteristic curve to aid in an understanding of the present invention.

To obtain the desired current regulation with a substantial decrease in power dissipation reference is now made to FIG. 4 which shows one embodiment of the present invention. In the circuit of FIG. 4, elements corresponding to those in FIG. 1 have like reference numerals. The difference between the circuits lies in the current supply means 23 which includes terminal 24 which may be connected to any source of suitable potential, and further includes sets of tunnel diodes and resistors connected in parallel circuit configuration. For example, the current supply means 23 includes resistor 32 in parallel with tunnel diode 33, the combination or set, being in series with a parallel circuit configuration comprising resistor 34 and tunnel diode 35. Before explaining the operation of the circuit of FIG. 4, reference should be made to FIG. 5 which shows a composite voltage-current characteristic curve obtained from the parallel arrangement of a tunnel diode and a resistor. The voltage-current characteristic curve 38 of a resistor rises linearly and has a constant slope. The voltage-current characteristic curve 40 of a tunnel diode has two regions of positive resistance and a negative resistance region between these latter positive resistance regions. The characteristic curve increases in a first positive resistive region to a peak point P and then enters the negative resistance region from peak point P to the valley point $V_v$ and then goes into a second region of positive resistance. If the absolute value of the negative resistance portion between P and $V_V$ is chosen to be equal to the resistance of the resistor, a composite voltage current characteristic curve 42 results, and will have a substantially constant current in the voltage range from A to B. The parallel arrangement of a tunnel diode and a resistance element therefore provides a non-linear resistance having a desired predetermined current which is substantially constant over a predetermined voltage range. If different currents having different predetermined values are required, different sets of tunnel diodes and resistors in series may be provided in the current supply means for the transistor circuit. The composite voltage current characteristic curve 46 of FIG. 6 results from the serial arrangement of tunnel diode 33 and resistor 32 in parallel, and the tunnel diode 35 and resistor 34 in parallel, of the current supply means 23 in FIG. 4. The values of the resistors, and the characteristic of the tunnel diodes used, are chosen such that there results two substantially constant currents having different values, one from point 48 to 50, and the other from point 52 to 54, in the composite voltage current characteristic curve 46 in FIG. 6. The supply voltage $V_{cc}$ is chosen such that the saturation characteristic 30 intersects the second constant current between the portion 52 to 54 of the characteristic curve As was previously stated, when the transistors of the first stage are in an OFF condition, the current supply means will supply a predetermined current to the control electrode 150 of the second stage 120. The input operating characteristics of this second stage is plotted in FIG. 6 from right to left as curve 60 which intersects the first predetermined constant current between the points 48 and 50. If the saturation characteristics of the transistors of the first stage shift to a new position such as 30′, operation will still be along the constant current portion from point 52 to point 54. Similarly, with the transistors of the first stage in an OFF state of operation and with the current being supplied to the second stage, a shifting of the input characteristic 60 to a new position 60′ will still maintain operation in the constant current portion from point 48 to point 50 of the composite curve 46.

Figure 7:
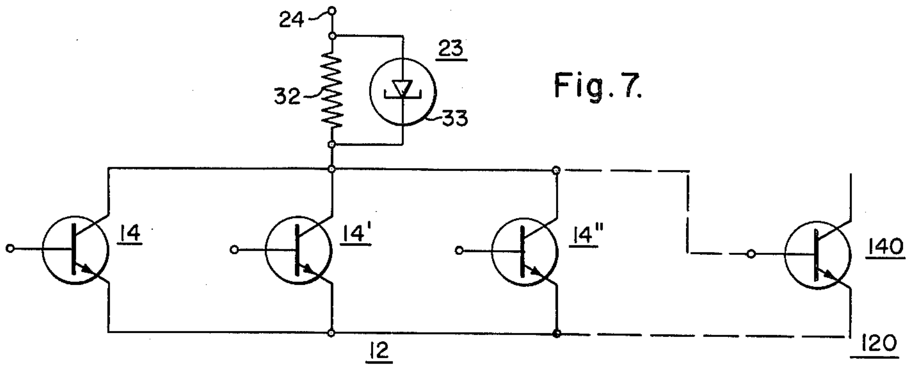
FIG. 7 shows another embodiment of the present invention.

Accordingly, there has been provided transistor circuitry in the form of a logic circuit which utilizes a non-linear resistance in the current supply means therefor such that predetermined operating currents are maintained, regardless of slight variations in the operating characteristics of the transistors utilized. Due to the operating characteristics of the non-linear resistance utilized, the voltage supply may be greatly reduced thereby reducing power dissipation in the circuit. With transistor circuitry requiring only a single constant current, the current supply means 23 may comprise a single set of parallel arrangement of a resistor 32 and tunnel diode 33, for example, as shown in FIG. 7. It may also be seen that by utilizing a plurality of sets of tunnel diodes and resistors in series, a plurality of constant current levels may be obtained to match various operating characteristics of the particular circuitry utilized.

Although the present invention has been described with a certain degree of particularity, it is to be understood that changes and modifications may be made thereto without departing from the spirit and scope of the invention.

I claim as my invention:

1. A semiconductor logic circuit comprising, in combination: a plurality of transistors each having an input, collector and an emitter electrode; the collector to emitter current paths of said transistors connected in parallel configuration with each collector joined at a common point; output means connected to the collectors of said transistors; current supply means connected to said common point, said current supply means including a resistance element and a tunnel diode connected in parallel circuit configuration with said resistance element; said tunnel diode having a negative resistance portion in its voltage-current characteristic curve substantially equal in absolute value to the resistance of said resistance element, and said transistors operate on the portion of the tunnel diode voltage-current characteristic defined by the absolute value of the negative resistance portion equal to the resistance of the resistance element.

2. A semiconductor logic circuit comprising in combination: a first stage including a transistor having a control, emitter and collector electrode; output means connected to said collector electrode; a second stage including a transistor having a control, emitter and collector electrode, said latter control electrode being connected to said output means; current supply means connected to said collector electrode of the transistor of said first stage and including a first resistance element in parallel with a first tunnel diode, and a second resistance element in parallel with a second tunnel diode; said first resistance element and tunnel diode providing a first substantially constant current over a first predetermined voltage range; said second resistance element and tunnel diode providing a second substantially constant current over a second predetermined voltage range.

3. A semiconductor logic circuit comprising in combination: a first stage including a transistor having a control, emitter and collector electrode; output means connected to said collector electrode; a second stage including a transistor having a control, emitter and collector electrode, said latter control electrode being connected to said output means; current supply means connected to said collector electrode of the transistor of said first stage and including a first resistance element in parallel with a first tunnel diode, and a second resistance element in parallel with a second tunnel diode; said first resistance element and tunnel diode providing a first substantially constant current over a first predetermined voltage range; said second resistance element and tunnel diode providing a second substantially constant current over a second predetermined voltage range, said second resistance element and tunnel diode having values such that said second substantially constant current is of a greater value than said first substantially constant current; said second constant current being supplied to said first stage when its transistor is ON; said first constant current being supplied to said second stage when the first stage transistor is OFF.

4. A semiconductor logic circuit comprising, in combination: a plurality of transistors each having a control, emitter and collector electrode and arranged in circuit configuration to provide a predetermined output signal in response to input signals at the control electrodes thereof; current supply means for supplying current to said transistors and including a resistor and a tunnel diode in parallel circuit configuration, said resistor and tunnel diode parallel arrangement having a composite voltage-current characteristic curve exhibiting a constant current portion over a predetermined voltage range; said transistors each having associated operating characteristics; said current supply means chosen such that at least one of said characteristics is operative along said constant current portion of said voltage-current characteristic curve.

5. A semiconductor logic curve comprising, in combination: a first stage including a plurality of transistors each having a control, emitter and collector electrode; said collector electrodes joined at a common point; output means connected to said common point for providing an output signal in response to input signals at the control electrodes of said transistors; a second stage including a transistor having a control electrode for receiving any output signal from said output means; means for supplying a first predetermined substantially constant current to said second stage in the absence of an input signal, and a second predetermined substantially constant current to said first stage when an input signal exists, said latter means including a serial arrangement of a first resistor in parallel with a first tunnel diode and a second resistor in parallel with a second tunnel diode, each tunnel diode having a negative resistance portion in its voltage current characteristic curve equal to the absolute magnitude of the resistance of its associated resistor; said first resistor and tunnel diode providing said first current to match the saturation characteristics of the transistors of said first stage whereby said first current remains substantially constant despite slight variations in said saturation characteristics; said second resistor and tunnel diode providing said second current to match the input characteristics of said second stage whereby said second current remains substantially constant despite slight variations in said input characteristics.

References Cited by the Examiner

UNITED STATES PATENTS

| | | | |
|---|---|---|---|
| 2,954,483 | 9/1960 | Ulrich | 307—88.5 |
| 3,076,105 | 1/1963 | Robinson et al. | 307—88.5 |
| 3,089,039 | 5/1963 | Abraham | 307—88.5 |
| 3,090,926 | 5/1963 | Engel | 307—88.5 |
| 3,127,574 | 3/1964 | Sommers | 307—88.5 |

OTHER REFERENCES

"Design of Transistorized Circuits for Digital Computers," by Abraham Pressman, John F. Rider, publisher, 1959.

G. E. publication by Sylvan et al., "Tunnel Diodes as Amplifiers and Switches," reprint from Electronic Equipment Engineering," May 1960 (page 6 relied on).

JOHN W. HUCKERT, *Primary Examiner.*